(12) United States Patent
Ezzeddine

(10) Patent No.: US 7,199,682 B2
(45) Date of Patent: Apr. 3, 2007

(54) DISTRIBUTED BALUN WITH A NON-UNITY IMPEDANCE RATIO

(75) Inventor: Hilal Ezzeddine, Tours (FR)

(73) Assignee: STMicroelectronics S.A., Montrouge (FR)

( * ) Notice: Subject to any disclaimer, the term of this patent is extended or adjusted under 35 U.S.C. 154(b) by 6 days.

(21) Appl. No.: 10/981,881

(22) Filed: Nov. 5, 2004

(65) Prior Publication Data
US 2005/0099241 A1  May 12, 2005

(30) Foreign Application Priority Data
Nov. 7, 2003  (FR) ................... 03 50813

(51) Int. Cl.
*H03H 7/00* (2006.01)
*H01F 5/00* (2006.01)

(52) U.S. Cl. .................. 333/177; 333/26; 336/200

(58) Field of Classification Search ........ 333/25, 333/26, 177; 336/200
See application file for complete search history.

(56) References Cited

U.S. PATENT DOCUMENTS

| 5,451,914 | A | * | 9/1995 | Stengel .................. 333/25 |
| 5,477,204 | A | | 12/1995 | Li |
| 5,497,137 | A | * | 3/1996 | Fujiki .................. 336/200 |
| 6,097,273 | A | | 8/2000 | Frye et al. |
| 6,927,662 | B2 | * | 8/2005 | Kahlmann et al. ...... 336/200 |

OTHER PUBLICATIONS

French Search Report from corresponding French Application No. 03/50813, filed Nov. 7, 2003.
Patent Abstracts o Japan, vol. 2002, No. 06, Jun. 4, 2002 & JP 2002 050910 A (Taiyo Yuden Co. Ltd.), Feb. 15, 2002.

* cited by examiner

*Primary Examiner*—Dean Takaoka
(74) *Attorney, Agent, or Firm*—Lisa K. Jorgenson; James H. Morris; Wolf, Greenfield & Sacks, P.C.

(57) ABSTRACT

A mode-switching transformer having a first conductive line formed of two primary windings electrically in series, and the length of which is a function of a central operating frequency of the transformer; and a second conductive line formed of two secondary windings electrically in series, coupled two-by-two with the primary windings, the length of which is a function of said central frequency. The conductive lines exhibit different widths selected according to the desired impedance ratio of the transformer.

8 Claims, 2 Drawing Sheets

DISTRIBUTED BALUN WITH A NON-UNITY IMPEDANCE RATIO

BACKGROUND OF THE INVENTION

1. Field of the Invention

The present invention relates to mode-switching transformers which are used to convert a voltage from the common mode to a differential mode and conversely. Such transformers are generally called "balun" (balanced-unbalanced) transformers.

2. Discussion of the Related Art

A mode-switching transformer is, for example, used in radio frequency transceiver chains, for example, of mobile phones. This type of application currently uses devices of balun type, the antenna side being most often associated with a single-ended device.

Two categories of mode-switching transformers are coupled-line or distributed baluns, and baluns with discrete components. Baluns with coupled lines are formed of pairs of coupled conductive tracks, the transformer's operating frequency being conditioned by the line length. Baluns with discrete components are formed of capacitive and inductive components forming LC cells.

The present invention more specifically relates to baluns with coupled lines. Among these, the present invention more specifically relates to a Marchand-type balun, that is, a symmetrical balun having its coupled lines calculated from a λ/4 length, where λ represents the wavelength corresponding to the central frequency of the desired passband of the balun.

FIG. 1 very schematically shows the function of a balun 1. On the common-mode side, the device includes a so-called common-mode port 2 (for example, intended to be connected to the end of an antenna). On the differential mode side, the balun includes two ports 3 and 4 symmetrical with respect to a reference M, generally the ground on the side of the equipment for processing the received signals. On the common mode side, the received signal is most often referenced to earth T. The grounds on the common mode and on the differential mode sides may (but not necessarily) exhibit potentials different from each other. For a perfectly symmetrical balun, a voltage V on the common mode side is converted into two voltages V/2 on the differential mode side.

FIG. 2 very schematically shows the equivalent electric diagram of a conventional Marchand type balun. Four conductive sections 5 to 8, each having a quarter wavelength (λ/4) are coupled two by two. Two first sections 5 and 6 are in series between common-mode port 2 and a port 9 generally open and left floating. The other two sections 7 and 8 are in series between the two differential mode ports 3 and 4 and have their midpoint 10 connected to ground M forming the reference on the differential side. The signals present on differential mode input-output terminals 3 and 4 are phase-shifted by 180° with respect to each other.

FIG. 3 very schematically shows in the form of blocks an example of an assembly using a balun 1 of the type to which the present invention applies. In this example, the common-mode port 2 is connected to the end of a radio frequency transceiver antenna 11 and the two differential ports are intended to be connected to circuits 12 of exploitation of the received signals and of preparation of the signals to be transmitted (APPLI). Between balun 1 and circuit(s) 12 is provided an impedance matching circuit 13 (ZMATCH), necessary in most applications.

A balun such as illustrated in FIG. 2 in which all the conductive sections have identical structures and same lengths provides a unity impedance ratio between the primary (common mode) and the secondary (differential mode).

According to the application, the circuits on the primary and secondary side may or may not have the same impedance (for example, 50 Ω). A non-unity impedance ratio may be required (for example, 50/100 between the antenna (50 Ω) and surface acoustic wave filters (100 Ω), 50/200, 25/50, 100/25, etc.).

Conventionally, to modify the impedance ratio of a balun with coupled lines, the spirals on one of the balun sides are connected in parallel. FIG. 4 shows the equivalent electric diagram of an example of such a balun with a non-unity impedance ratio. In FIG. 4, coupled lines 5 to 8 have been shown in the form of inductances since they most often are coupled spirals. On the primary side, the two spirals 5 and 6 are in series. On the secondary side, spirals 7 and 8 are (50 Ω) connected in parallel. Thus, for a voltage V present on the common-mode port 2 generating a current I in spirals 5 and 6 in series, a voltage V/2 is obtained across each spiral 7 and 8 but said spirals conduct a current 2I. Accordingly, the impedance ratio of such a balun here is 4 (for example, 200/50).

A problem to solve is the parallel connection of spirals 7 and 8. Indeed, baluns with coupled lines are most often made in the form of conductive tracks wound to gain space with respect to rectilinear tracks. The coupling between sections 5 and 7, respectively 6 and 8, is then obtained by forming these sections on the same level or in different conductive levels in interdigited and/or superposed fashion. Windings 5 and 6, respectively 7 and 8, are for example laterally spaced apart. In such a structure, the parallel connection of the two spirals requires additional vias and bridges. Further, for impedance ratios other than four or one quarter, the connections of multiple spirals in parallel make the forming of such baluns all the more complex.

SUMMARY OF THE INVENTION

The present invention aims at providing a Marchand-type distributed balun with a non-unity impedance ratio which is simple to form and which overcomes the disadvantages of known solutions.

The present invention especially aims at providing a solution which does not increase the need for vias and bridges of connection of conductive windings for a balun formed by means of conductive tracks wound in different conductive levels.

The present invention also aims at providing a solution which is compatible with the forming of a balun by means of superposed conductive windings.

To achieve these and other objects, the present invention provides a mode-switching transformer with coupled lines, in which the lines coupled two-by-two have different widths.

According to an embodiment of the present invention, the widths of the lines are selected according to the impedance ratio desired between the common-mode and differential-mode ports.

The present invention also provides a mode-switching transformer comprising a first conductive line formed of two primary windings electrically in series, and the length of which is a function of a central operating frequency of the transformer; and a second conductive line formed of two secondary windings electrically in series, coupled two-by-two with the primary windings, and the length of which is a function of said central frequency; the conductive lines having different widths selected according to the impedance ratio desired for the transformer.

According to an embodiment of the present invention, first and second windings of each of the lines are formed, laterally spaced apart, in a same conductive level, with the primary or secondary of the transformer having the smallest impedance having the largest line width.

According to an embodiment of the present invention, the two windings of each of the conductive lines are superposed in two different metal levels, with the primary or secondary of the transformer having the smallest impedance having the narrowest width.

According to an embodiment of the present invention, the intertrack between two spirals of a same winding is sized according to the desired impedance.

The foregoing objects, features, and advantages of the present invention will be discussed in detail in the following non-limiting description of specific embodiments in connection with the accompanying drawings.

DETAILED DESCRIPTION

Figure 1:
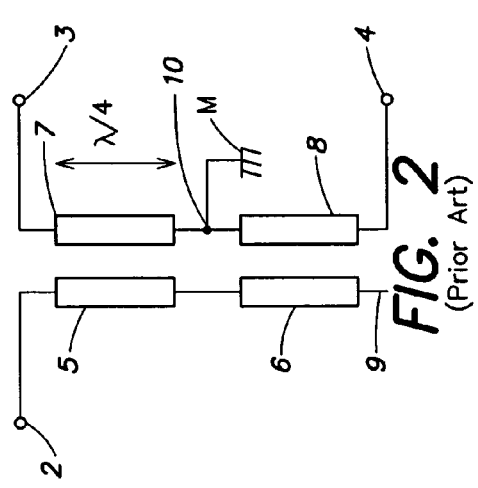
FIGS. 1 to 4, previously described, are intended to show the state of the art and the problem to solve.
Figure 2:
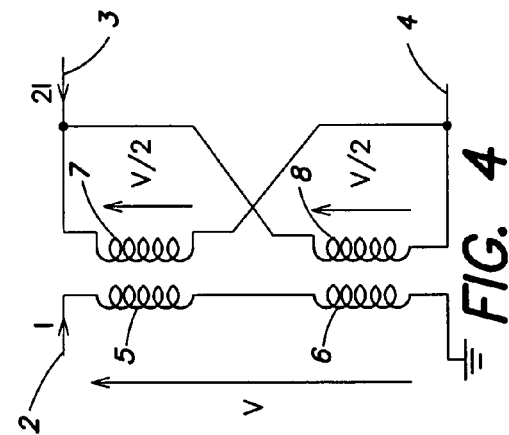
Figure 3:
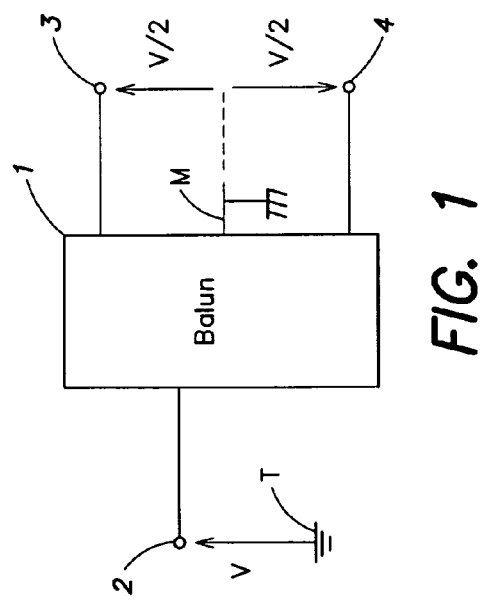
Figure 4:
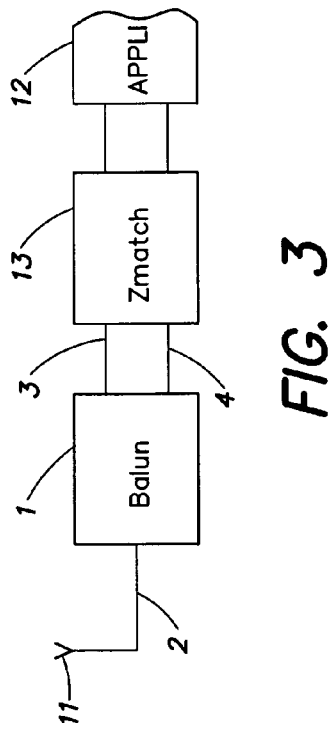

The same elements have been referred to with the same reference numerals in the different drawings. For clarity, only those elements which are necessary to the understanding of the present invention have been shown in the drawings and will be described hereafter. In particular, the upstream and downstream circuits of a balun have not been described in detail. The present invention applies whatever the circuits or equipment connected on the differential mode side and on the common mode side. Further, the practical forming of conductive windings on a multiple-level substrate has not been described in detail. The present invention may be implemented using conventional techniques of balun forming by means of conductive tracks.

A feature of the present invention is to provide conductive tracks having different widths between the primary (common mode) and the secondary (differential mode).

It could have been thought to modify the impedance ratio by modifying the number of spirals of the conductive tracks on one side with respect to the other to modify the values of the respective inductances and, accordingly, the impedance ratio. However, such a solution is incompatible with the need to have λ/4 line lengths for the entire balun.

Figure 5:
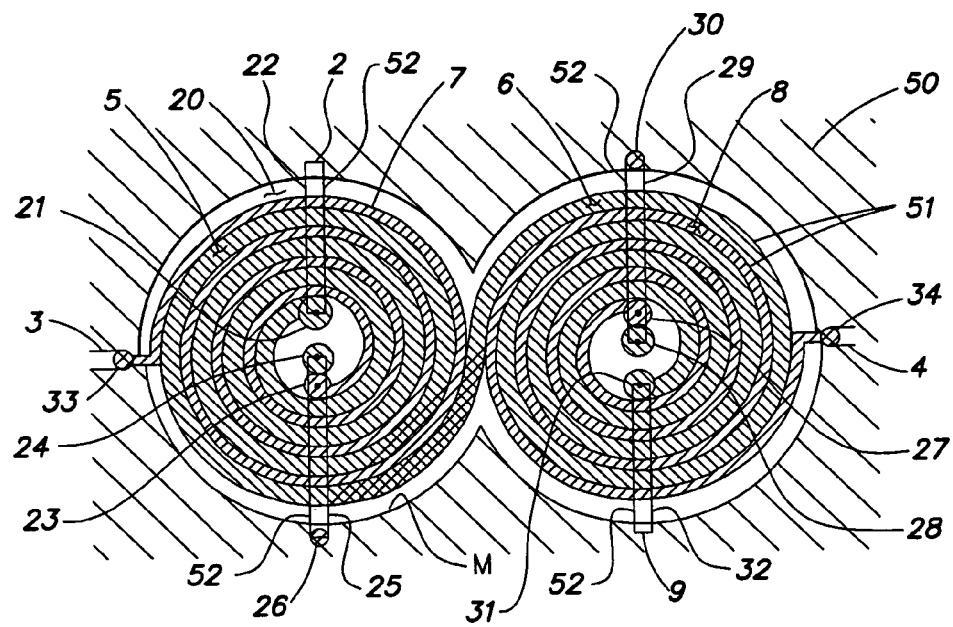
FIG. 5 shows in a top view an embodiment of a mode-switching transformer according to the present invention.

FIG. 5 is a top view of an embodiment of a mode-switching transformer according to the present invention. This balun may be formed on an insulating substrate 20 (for example, a glass substrate) on which are formed several conductive levels electrically isolated from one another. In the example of FIG. 5, at least three metal levels are necessary. In a first level 50 is generally formed a ground plane M corresponding to the differential mode ground. All the windings are here formed in a same conductive level 51 and a third level 52 is used to form bridges to have the central contacts of the windings come out.

For example, sections 5 and 6 are formed of two windings laterally spaced apart from each other and sections 7 and 8 are formed of windings interlaced in windings 5 and 6. A via 21 is used at the center of winding 5 to connect a bridge 22 in a different metallization level for connection of port 2. At the center of winding 7 are provided vias 23 and 24 for connection to ground plane M by means of a bridge 25 and a via 26. The same structure is reproduced on the side of windings 6 and 8 with vias 27 and 28 at the center of winding 8 to connect the ground plane with a bridge 29 and a via 30. In FIG. 5, a via 31 and a bridge 32 have been shown for connection to port 9. It should however be noted that this bridge and this via are generally omitted since port 9 is open. On the free end side of windings 7 and 8 are provided vias 33 and 34 for respective connections to differential-mode ports 3 and 4.

As illustrated in FIG. 5, the primary (5 and 6) and secondary (7 and 8) windings do not have the same width. In one example, the primary winding is narrower than the secondary winding, which results in a primary-to-secondary impedance ratio greater than one.

In a structure such as illustrated in FIG. 5 where the windings coupled two-by-two are laterally spaced apart, a decrease in the width of one of the conductive tracks with respect to the other increases its inductance and, accordingly, its impedance. For an impedance ratio greater than one, primary windings with tracks narrower than those of the secondary windings are provided, while for an impedance ratio smaller than one, secondary winding tracks narrower than those of the primary are provided.

Another parameter which conditions the impedance value is the intertrack, that is, the space between two spirals of the same inductance (of the same winding). The wider this intertrack, the more the impedance decreases since the mutual inductance decreases.

Figure 6:
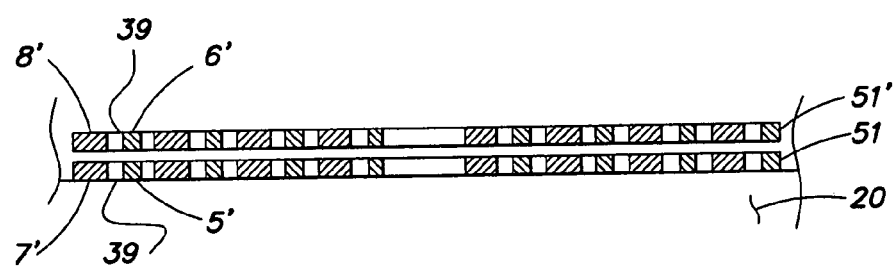

FIG. 6 is a schematic cross-sectional view of a balun according to a second embodiment of the present invention. The bridges and ground plan are similar to those of the first embodiment of FIG. 5. According to the second embodiment, the present invention is applied to a balun formed by means of stacked windings (5', 6', 7' and 8'), which amounts, in a way, to folding back the structure of FIG. 5 on itself. Such an embodiment requires at least one additional metal level 51' to be implemented.

According to this second embodiment, a decrease in the width of one of the windings decreases its inductance and accordingly its impedance because of the coupling between the two windings in series on the same side of the transformer. In the example of FIG. 6, the primary winding is narrower than the secondary winding, which results in a primary-to-secondary impedance ratio smaller than one. As for the interspiral 39, a decrease in the interspiral increases the inductance and thus increases the impedance.

Based on the indications given hereabove, it will be within the abilities of those skilled in the art to size the transformer windings on each mode switching according to its configuration (stacked or non-stacked) to obtain the desired impedance ratio.

Of course, the present invention is likely to have various alterations, modifications, and improvements which will readily occur to those skilled in the art. In particular, the sizing and the practical forming of a mode-switching transformer according to the present invention is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A mode-switching transformer comprising a first conductive line formed of two primary windings electrically connected in series, and the length of which is a function of a central operating frequency of the transformer; and a second conductive line formed of two secondary windings electrically connected in series, coupled two-by-two with the primary windings, the length of which is a function of said central frequency, said conductive lines having different widths selected according to the desired impedance ratio of the transformer, and first and second windings of each of the lines being formed, laterally spaced apart, in a same conductive level, with the primary windings or secondary windings of the transformer having the smallest impedance also having the largest line width.

2. A mode-switching transformer comprising a first conductive line formed of two primary windings electrically connected in series, and the length of which is a function of a central operating frequency of the transformer; and a second conductive line formed of two secondary windings electrically connected in series, coupled two-by-two with the primary windings, the length of which is a function of said central frequency, said conductive lines having different widths selected according to the desired impedance ratio of the transformer, the two windings of each of the conductive lines being superposed in two different metal levels, with the primary windings or secondary windings of the transformer having the smallest impedance also having the narrowest width, and wherein the two secondary windings are respectively interlaced with the two primary windings.

3. The mode-switching transformer of claim 1, wherein the intertrack between two spirals of a same winding is sized according to the desired impedance.

4. The mode-switching transformer of claim 2, wherein the intertrack between two spirals of a same winding is sized according to the desired impedance.

5. The mode-switching transformer of claim 1, having at least three conductive levels, comprising:
   a first conductive level which forms a ground plane;
   a second conductive level, wherein the primary and secondary windings are in said second conductive level; and
   a third conductive level used to form bridges for the central contacts of the windings.

6. The mode-switching transformer of claim 1, further comprising at least one via and at least one bridge to connect the primary windings to a common-mode port.

7. The mode-switching transformer of claim 1, further comprising at least one via and at least one bridge to connect the secondary windings to a ground plane.

8. The mode-switching transformer of claim 1, further comprising at least two vias for connecting the free side ends of the secondary windings to differential-mode ports.

* * * * *